(12) United States Patent
Shin

(10) Patent No.: US 7,848,179 B2
(45) Date of Patent: Dec. 7, 2010

(54) OUTPUT ENABLE SIGNAL GENERATING CIRCUIT AND METHOD

(75) Inventor: Beom-Ju Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 23 days.

(21) Appl. No.: 12/347,126

(22) Filed: Dec. 31, 2008

(65) Prior Publication Data
US 2009/0251187 A1 Oct. 8, 2009

(30) Foreign Application Priority Data
Apr. 2, 2008 (KR) ........................ 10-2008-0030733

(51) Int. Cl.
*G11C 8/18* (2006.01)
(52) U.S. Cl. ................. 365/233.13; 365/233.1
(58) Field of Classification Search ............. 365/233.1, 365/233.13
See application file for complete search history.

(56) References Cited

U.S. PATENT DOCUMENTS

| | | | |
|---|---|---|---|
| 6,446,180 B2 | 9/2002 | Li et al. | |
| 6,762,974 B1 | 7/2004 | Johnson et al. | |
| 6,977,848 B2 | 12/2005 | Choi | |
| 6,982,924 B2 | 1/2006 | Na | |
| 6,987,705 B2 | 1/2006 | Kim et al. | |
| 7,027,336 B2 | 4/2006 | Lee | |
| 7,081,784 B2 | 7/2006 | Kang | |
| 2006/0145894 A1* | 7/2006 | Kim et al. | 341/50 |
| 2007/0126468 A1* | 6/2007 | Kim | 326/30 |
| 2010/0109726 A1* | 5/2010 | Ahn et al. | 327/158 |

FOREIGN PATENT DOCUMENTS

| | | |
|---|---|---|
| JP | 2004-327008 | 11/2004 |
| KR | 1020050102507 A | 10/2005 |
| KR | 1020060077551 A | 7/2006 |
| KR | 1020070036635 A | 4/2007 |

OTHER PUBLICATIONS

Notice of Preliminary Rejection issued from Korean Intellectual Property Office on Aug. 28, 2009 with an English Translation.
Notice of Allowance issued from Korean Intellectual Property Office on Oct. 31, 2009.

* cited by examiner

*Primary Examiner*—Hoai V Ho
*Assistant Examiner*—Jay Radke
(74) *Attorney, Agent, or Firm*—IP & T Group LLP

(57) ABSTRACT

An output enable signal generating circuit including a first count value generation unit that provides a first count value by executing a counting operation, starting from an initial count value corresponding to a CAS latency information, the counting operation being executed in response to an internal clock signal, a second count value generation unit that provides a second count value that is counted in response to an external clock signal and an output enable signal generation unit for generating an output enable signal that is activated at every timing when the second count value and the first count value become equal to each other, in response to each of a plurality of read commands.

17 Claims, 11 Drawing Sheets

OUTPUT ENABLE SIGNAL GENERATING CIRCUIT AND METHOD

CROSS-REFERENCE TO RELATED APPLICATION

This application claims priority of Korean patent application number 10-2008-0030733, filed on Apr. 2, 2008, which is incorporated by reference in its entirety.

BACKGROUND OF THE INVENTION

The subject matter relates to a semiconductor design technology, and more particularly, to an output enable signal generating circuit and method for performing a domain crossing operation in a semiconductor memory device.

In general, a semiconductor memory device, such as a Double Data Rate Synchronous DRAM (DDR SDRAM) device, receives data from the outside of the device in response to an external clock signal, and outputs data stored therein in response to an internal clock signal. That is, the internal clock signal, not the external clock signal, is used for a data processing operation within a semiconductor memory device. From the perspective of data, the input of data is synchronized with the external clock signal and is output in synchrony with the internal clock signal. A situation in which a certain clock signal for data transfer changes to another is called a "domain crossing".

A semiconductor memory device is provided with various circuits to carry out such a domain crossing operation. One of these circuits is an output enable signal generating circuit. In the output enable signal generating circuit, a domain crossing occurs between a read command transferred in synchrony with an external clock signal and an internal clock signal, in order to generate an output enable signal. Thus, the domain-crossed output enable signal allows data and commands provided to the device to be synchronized with the external clock signal and for data to be output in accordance with a CAS latency. The CAS latency is a unit of time corresponding to one period of the external clock signal, and indicates a period of time from when the read command is input to when data is output.

Meanwhile, the semiconductor memory device also has an internal clock signal generating circuit to compensate for skew that may occur between an external clock signal and an internal clock signal due to delay elements within the device, such as a Phase Locked Loop (PLL) or a Delay Locked Loop (DLL). In the following description, a DLL clock signal generated by a DLL will be used for illustrative purposes.

FIG. 1 is a block diagram showing an output signal generating circuit in a conventional semiconductor memory device.

Referring to FIG. 1, the output enable signal generating circuit includes a counter reset signal generator 110, an initialization unit 120, a DLL clock counter 130, a delay model 140, an external clock counter 150, a latch 160, and a comparator 170.

The counter reset signal generator 110 generates a first reset signal RSTB_DLL, to reset the DLL clock counter 130, in response to a reset signal RSTB and a DLL clock signal CLK_DLL. Here, the reset signal RSTB is generated by decoding plural external commands (e.g., /RAS, /CAS, /CS, and /WE).

The initialization unit 120 provides the DLL clock counter 130 with an initial count value corresponding to a CAS latency CL. Table 1 below lists initial count values that correspond to CAS latencies CL3 to CL6, and their corresponding output signals S<0:2> from the initialization unit 120. Initial count values corresponding to the CAS latencies CLs may vary depending on the design.

TABLE 1

| CL | Initial count value | S<2> | S<1> | S<0> |
|----|---------------------|------|------|------|
| 3  | 5                   | 1    | 0    | 1    |
| 4  | 4                   | 1    | 0    | 0    |
| 5  | 3                   | 0    | 1    | 1    |
| 6  | 2                   | 0    | 1    | 0    |

The DLL clock counter 130 is reset in response to the first reset signal RSTB_DLL, and executes a counting operation in response to a DLL clock signal CLK_DLL, starting from an initial count value corresponding to the output signal S<0:2> provided by the initialization unit 120. For example, suppose that '5' is set for an initial count value, corresponding to CL3. Then, the DLL clock counter 130 generates, in response to the DLL clock signal CLK_DLL, a DLL clock count value CNT_DLL<0:2> counting from 3. As another example, suppose that '4' is set for an initial count value corresponding to the CL4. Then, the DLL clock counter 130 generates, in response to the DLL clock signal CLK_DLL, a DLL clock count value CNT_DLL<0:2> counting from 4. That is to say, the DLL clock counter 130 executes a counting operation in response to the DLL clock signal CLK_DLL, starting from a preset initial count value in accordance with a CL.

The delay model 140 delays the first reset signal RSTB_DLL to compensate for a phase difference between an external clock signal CLK_EXT and its corresponding DLL clock signal CLK_DLL, and outputs it as a second reset signal RSTB_EXT.

The external clock counter 150 is reset to an initial count value in response to the second reset signal RSTB_EXT, and executes a counting operation in response to the external clock signal CLK_EXT. Here, the initial count value for the external clock counter 150 is set to 0.

The latch 160 latches, in response to a read command RD, an external clock count value CNT_EXT<0:2>, which is an output signal from the external clock counter 150, and outputs the latched external clock count value CNT_LAT<0:2>.

The comparator 170 compares the DLL clock count value CNT_DLL<0:2> with the latched external clock count value CNT_LAT<0:2>, making an output enable signal OE active when those two values are equal to each other. Here, the output enable signal OE is a signal synchronized with the DLL clock signal CLK_DLL, and conveys information about the CAS latency CL. Thus, the activation timing of the output enable signal OE varies depending on the CAS latency CL. As information, the output enable signal OE has a pulse width corresponding to burst length information, and is used for outputting data.

FIG. 2 is a timing diagram showing an operation timing of the output enable signal generating circuit depicted in FIG. 1. For convenience of explanation, "CL4" indicates that a CAS latency CL is 4, and similarly "CL6" indicates that a CAS latency CL is 6.

First, a case where the CAS latency CL is 4 (CL4) is explained.

An initial count value of the initialization unit 120 is set to 4, in accordance with Table 1 above. When the first reset signal RSTB_DLL has a logic 'high' level, the DLL clock counter 130 executes a counting operation in response to the DLL clock signal CLK_DLL starting from 4 as the initial count value, and outputs a DLL clock count value CNT_DLL<0:2>.

Next, the delay model 140 outputs a second reset signal RSTB_EXT by imposing a delay time D on the first reset signal RSTB_DLL. The external clock counter 150, which has been released from reset in response to the second reset signal RSTB_EXT switching to a logic 'high' level, outputs, in response to the external clock signal CLK_EXT, an external clock count value CNT_EXT<0:2>, counting from an initial count value of 0.

When a read command RD is input, the latch 160 latches an external clock count value CNT_EXT<0:2>, i.e. 3, in response to a read command RD that is applied at the timing when the external clock signal CLK_EXT is labeled 0, and outputs it as a latched external clock count value CNT_LAT<0:2>. The comparator 170 compares the DLL clock count vale CNT_DLL<0:2> with the latched external count value CNT_LAT<0:2>, to activate an output enable signal OE when those two count values are equal to each other, that is, when the DLL clock count value CNT_DLL<0:2> becomes 3. The output enable signal OE so generated is used for outputting data synchronized with the timing corresponding to the fourth clock period of CLK_EXT after the read command RD.

Next, a case where the CAS latency CL is 5 (CL5) is explained.

An initial count value of the initialization unit 120 is set to 3, in accordance with Table 1 above. When the first reset signal RSTB_DLL is activated to a logic 'high' level, the DLL clock counter 130 executes a counting operation in response to the DLL clock signal CLK_DLL starting from 3 as the initial count value, and outputs a DLL clock count value CNT_DLL<0:2>. The external clock counter 150, which has been released from reset in response to the second reset signal RSTB_EXT, outputs an external clock count value CNT_EXT<0:2>, counting from an initial count value of 0.

When a read command RD is input, the latch 160 latches an external clock count value CNT_EXT<0:2>, i.e. 3, and outputs it as a latched external clock count value CNT_LAT<0:2>. The comparator 170 compares the DLL clock count vale CNT_DLL<0:2> with the latched external count value CNT_LAT<0:2>, to activate an output enable signal OE when those two count values are equal to each other, that is, when the DLL clock count value CNT_DLL<0:2> becomes 3.

Lastly, a case where the CAS latency CL is 6 (CL6) is discussed.

An initial count value of the initialization unit 120 is set to 2, in accordance with Table 1 above. The DLL clock counter 130 executes a counting operation in response to the DLL clock signal CLK_DLL starting from 2 as the initial count value, and outputs a DLL clock count value CNT_DLL<0:2>, which is incremented by the counting operation. The external clock counter 150 outputs an external clock count value CNT_EXT<0:2>, counting from an initial count value of 0.

When a read command RD is input, the latch 160 latches an external clock count value CNT_EXT<0:2>, i.e. 3, and outputs it as a latched external clock count value CNT_LAT<0:2>. The comparator 170 compares the DLL clock count value CNT_DLL<0:2> with the latched external count value CNT_LAT<0:2>, to provide an output enable signal OE activated when those two count values are equal to each other, that is, when the DLL clock count value CNT_DLL<0:2> becomes 3.

Meanwhile, the read command RD can be input at a fixed interval tCCD. Here, tCCD defines a minimum time gap between consecutive read commands RD. For example, for a DDR2 device, two clock periods of the external clock signal CLK_EXT are designated as tCCD, while for a DDR3 device, three clock periods of the external clock signal CLK_EXT are designated as tCCD.

The output enable signal generating circuit with the conventional configuration as discussed above exhibits a problem as shown in FIG. 3, regarding read commands RD1 and RD2 that are applied at the interval of tCCD.

FIG. 3 is a timing diagram for a case where the read command RD of FIG. 2 is repeated at the interval of tCCD. For convenience of explanation, a DDR2 device is used by way of example. In this case, tCCD is two clock periods of the external clock signal CLK_EXT. That is, if a first read command RD1 is applied at the timing where the external clock signal CLK_EXT is labeled 0, then a second read command RD2 can be applied as early as when the external clock signal CLK_EXT is labeled 2.

First, a case where a CAS latency CL is 4 will be explained.

An initial count value of the initialization unit 120 is set to 4. When the first reset signal RSTB_DLL has a logic 'high' level, the DLL clock counter 130 executes a counting operation in response to the DLL clock signal CLK_DLL starting from 4 as the initial count value, and outputs a DLL clock count value CNT_DLL<0:2>.

Next, the delay model 140 outputs a second reset signal RSTB_EXT by imposing a delay time D on the first reset signal RSTB_DLL. The external clock counter 150, which has been released from reset in response to the second reset signal RSTB_EXT switching to a logic 'high' level, outputs, in response to the external clock signal CLK_EXT, an external clock count value CNT_EXT<0:2>, counting from an initial count value of 0. When a read command RD1 is input, the latch 160 latches an external clock count value CNT_EXT<0:2>, i.e. 3, when the first read command RD1 is input at the timing when the external clock signal CLK_EXT is labeled 0, and outputs it as a latched external clock count value CNT_LAT<0:2>.

Since tCCD is two clock periods of CLK_EXT, the second read command RD2 can be input at the timing when the external clock signal CLK_EXT is labeled 2, before the DLL clock count value CNT_DLL<0:2> becomes 3. Then, the latch 160 latches an external clock count value CNT_EXT<0:2>, i.e., 5, in response to the second read command RD2, and outputs it as a latched external clock count value CNT_LAT<0:2>.

Thus, the comparator 170 compares the DLL clock count value CNT_DLL<0:2> with the latched external clock count value CNT_LAT<0:2>, and activates an output enable signal OE at the timing when those two count values become equal to each other, that is, when the DLL clock count value CNT_DLL<0:2> becomes 5. As can be seen in FIG. 3, the output enable signal OE ignores the first read command RD1, but becomes activated in response to the second read command RD2. This means that the output enable signal OE is not activated at a desired time corresponding to the read command RD1, and thus, a semiconductor memory device outputs data without regard to the CAS latency CL 4. In other words, the semiconductor memory device has malfunctioned.

Next, in a case where a CAS latency CL is 5, the latch 160 latches 3 corresponding to the first read command RD1 first, and then latches 5 corresponding to the second read command RD2, as in the case where a CAS latency CL is 4. Similarly, the output enable signal OE is not activated at a desired time corresponding to the read command RD1.

For the conventional output enable signal generating circuit as noted earlier, if read commands are input consecutively, especially when the second read command is input before an external clock count value CNT_LAT<0:2> latched in response to the first read command is compared with a desired DLL clock count value CNT_DLL<0:2> at the comparator 170, the output enable signal OE will not be activated at a desired time. In other words, if a CAS latency CL is greater than tCCD, the output enable signal OE canis not activated at a desired time. That is, the output enable signal OE is not activated corresponding to a desired CAS latency CL, and an output enable signal OE causes malfunctioning of a semiconductor memory device and further impairs the precision and reliability of the device.

Furthermore, as the operating frequency of semiconductor memory devices continue to increase, nowadays into the GHz, a CAS latency CL increases more or more accordingly. Accordingly, the aforementioned problems will occur more frequently.

SUMMARY OF THE INVENTION

Embodiments of the present invention are directed to providing an output enable signal generating circuit and method, which can generate an output enable signal being activated in response to each of consecutively applied read commands.

The output enable signal generating circuit in accordance with the present invention includes the same number of latches as read commands being applied consecutively, each of which latches an external clock signal corresponding to each of the read commands to activate the output enable signal at an appropriate time in response to each read command.

More specifically, the first embodiment of the present invention is characterized by comprising a plurality of latches and a plurality of comparators corresponding respectively to the latches to provide an output enable signal. In addition, the second embodiment of the present invention is characterized by comprising a plurality of latches and a comparator to provide an output enable signal. The second embodiment of the present invention can guarantee a faster operation speed than that of the first embodiment.

In accordance with an aspect of the present invention, there is provided an output enable signal generating circuit comprising a first count value generation unit that provides a first count value by executing a counting operation, starting from an initial count value corresponding to a CAS latency information, the counting operation being executed in response to an internal clock signal, a second count value generation unit that provides a second count value that is counted in response to an external clock signal and an output enable signal generation unit that provides an output enable signal that is activated at every timing when the second count value and the first count value become equal to each other, in response to each of a plurality of read commands.

In accordance with other aspect of the present invention, there is provided a first count value generation unit that provides a first count value by executing a counting operation, starting from an initial count value corresponding to a CAS latency information, the counting operation being executed in response to an internal clock signal, a second count value generation unit that provides a second count value that is counted in response to an external clock signal, a plurality of latches that latch the second count value in response to each of consecutively applied read commands and a comparison output unit that activates an output enable signal based on a comparison of output signals from the plurality of latches with the first count value.

DETAILED DESCRIPTION

Hereinafter, preferred embodiments in accordance with the present invention will be described in detail with reference to the accompanying drawings so as to be-readily be practiced by those skilled in the art.

Figure 1:
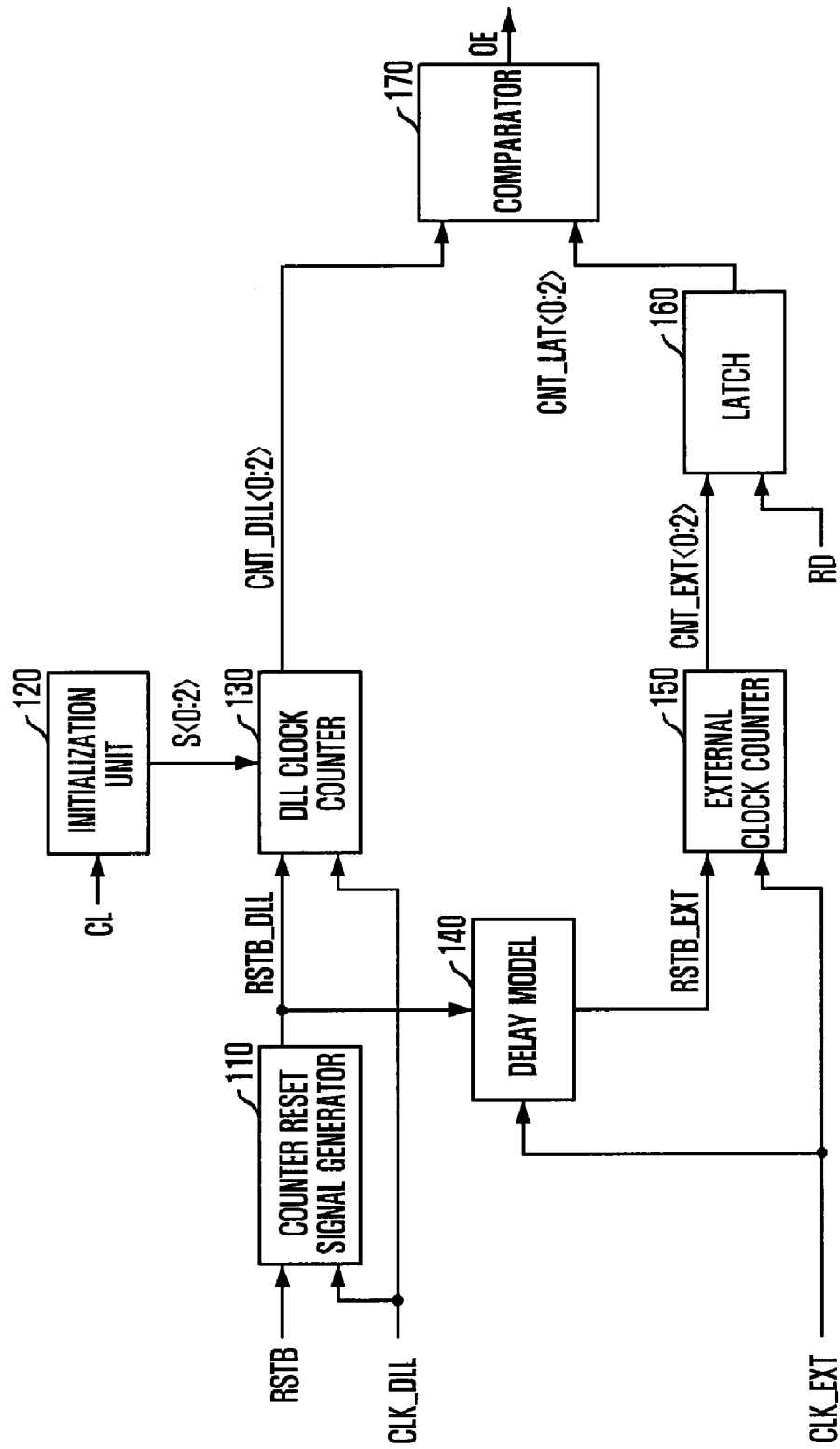
FIG. 1 is a block diagram showing a conventional output enable signal generating circuit in a semiconductor memory device.
Figure 2:
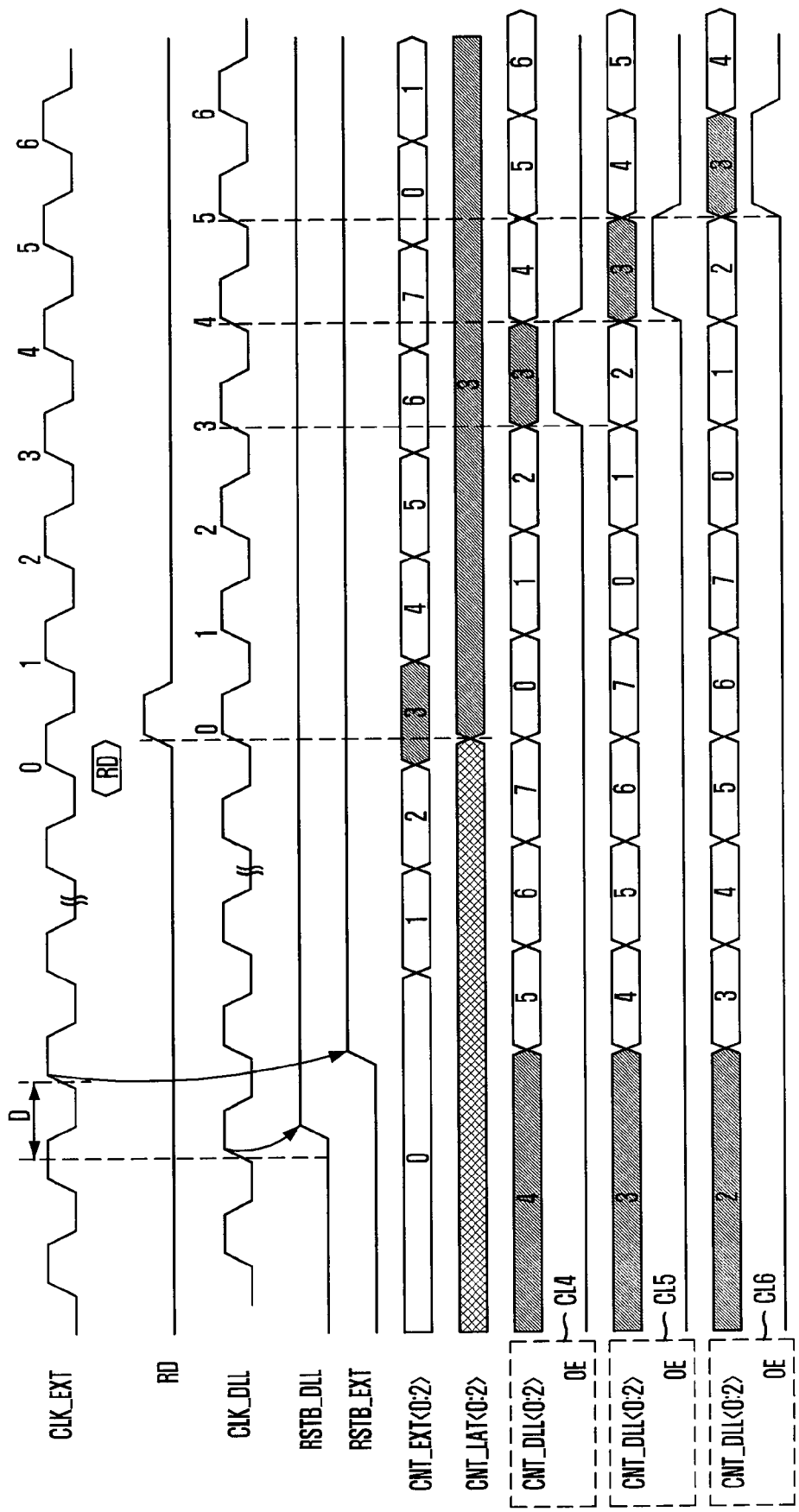
FIG. 2 is a timing diagram showing the timing of an operation in the output enable signal generating circuit of FIG. 1.
Figure 3:
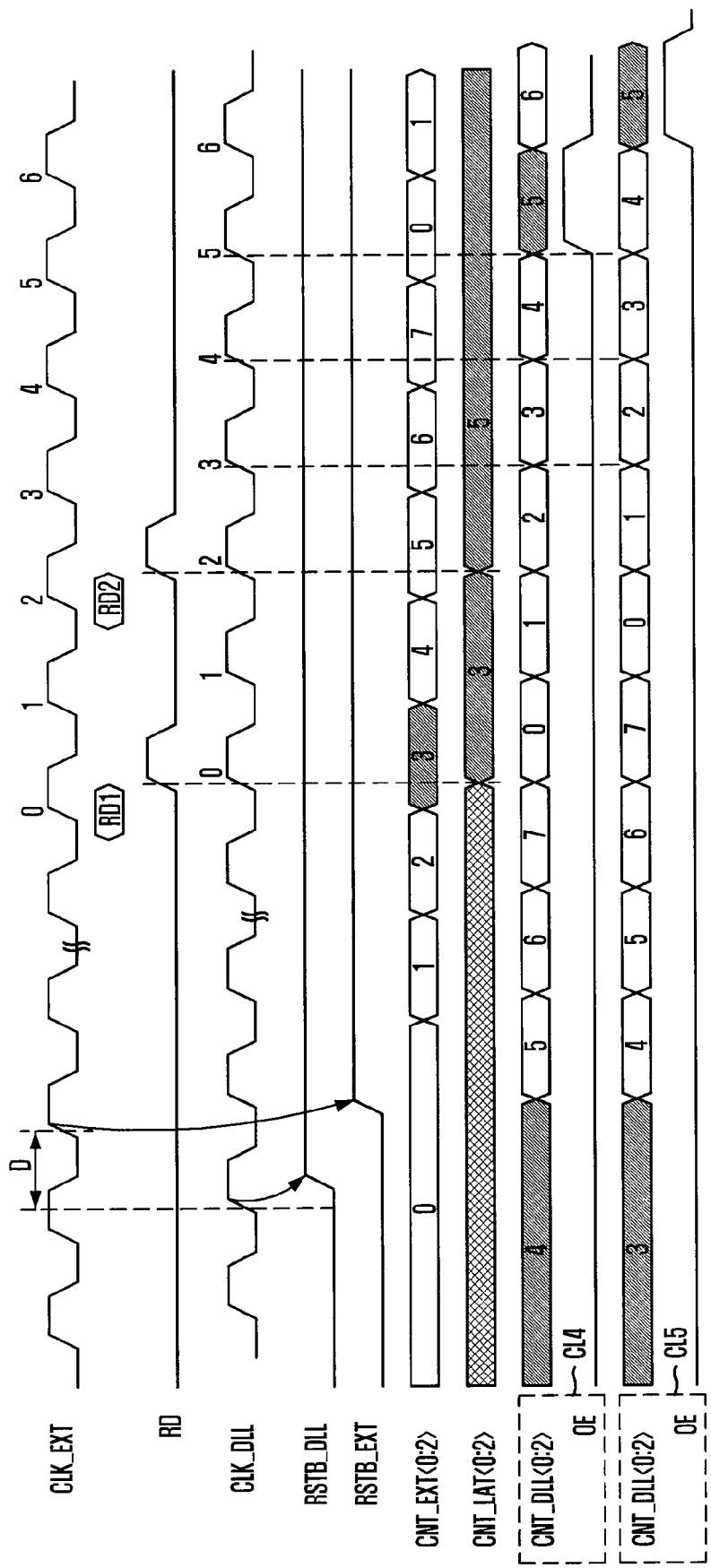
FIG. 3 is a timing diagram showing a case where a read command RD of FIG. 2 is applied at an interval of tCCD.
Figure 4:
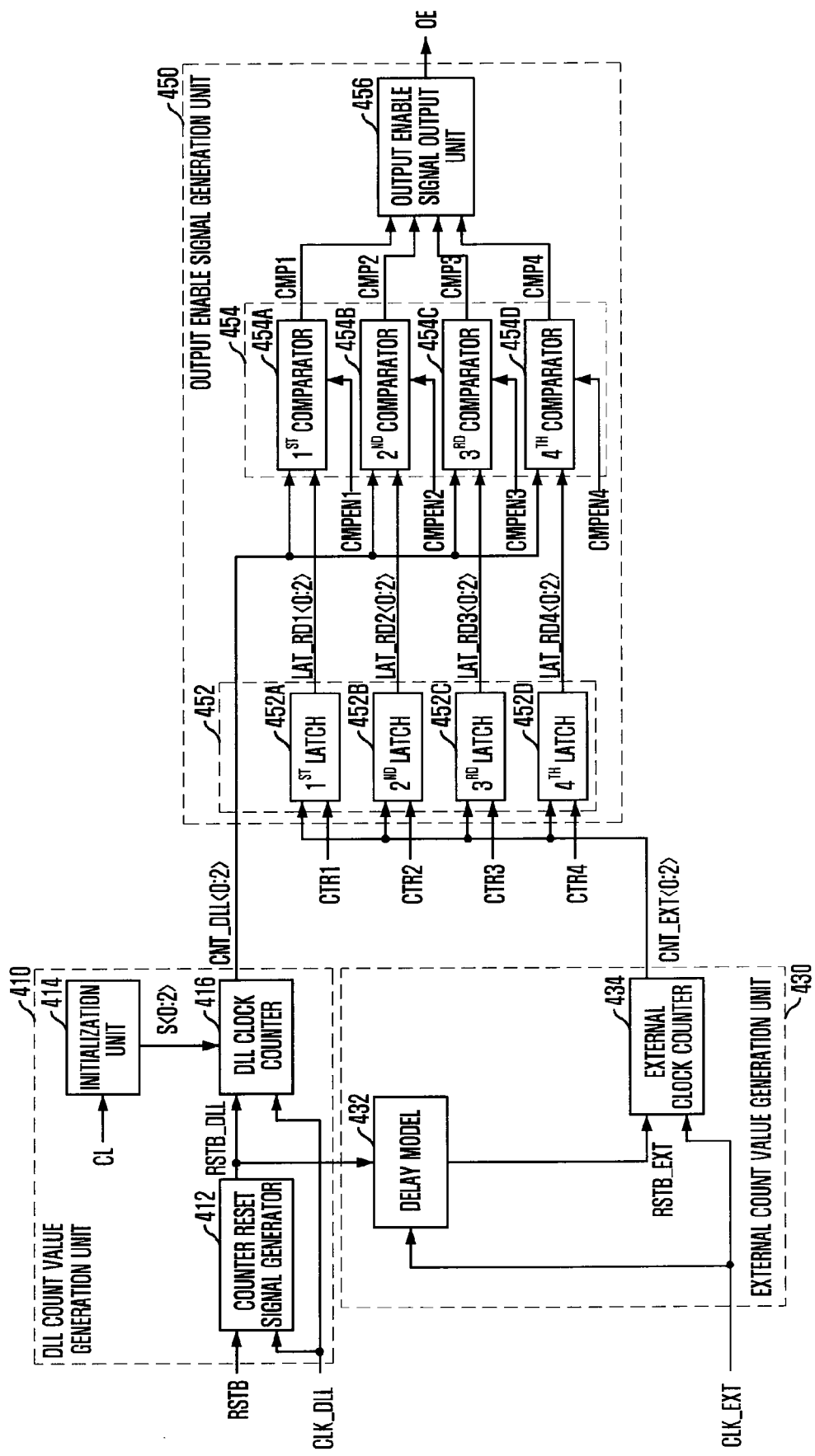
FIG. 4 is a block diagram illustrating an output enable signal generating circuit, in accordance with a first embodiment of the present invention.

FIG. 4 is a block diagram illustrating an output enable signal generating circuit, in accordance with a first embodiment of the present invention.

Referring to FIG. 4, the output enable signal generating circuit includes a DLL count value generation unit 410, an external count value generation unit 430, and an output enable signal generation unit 450. The DLL count value generation unit 410 provides a DLL clock count value CNT_DLL<0:2> which is counted in response to a DLL clock signal CLK_DLL as an internal clock signal, starting from an initial count value corresponding to a CAS latency CL. The DLL count value generation unit 410 includes a counter reset signal generator 412, an initialization unit 414, and a DLL clock counter 416.

The counter reset signal generator 412 generates a first reset signal RSTB_DLL to reset the DLL clock counter 416, in response to a reset signal RSTB and the DLL clock signal CLK_DLL. Here, the reset signal RSTB is generated by decoding plural external commands (e.g., /RAS, /CAS, /CS, and /WE). The first reset signal RSTB_DLL is synchronized with the DLL clock signal CLK_DLL.

The initialization unit 414 provides the DLL clock counter 416 with an initial count value corresponding to a CAS latency CL. An initial count value in accordance with a CAS latency CL and a corresponding output signal S<0:2> from the initialization unit 414 may differ from ones listed in Table 1 above, depending on the design used.

The DLL clock counter 416 is reset in response to the first reset signal RSTB_DLL, and executes a counting operation in response to the DLL clock signal CLK_DLL starting from an initial count value corresponding to the output signal S<0:2> provided by the initialization unit 414, to output a DLL clock count value CNT_DLL<0:2>. That is, the DLL clock counter 416 performs a counting operation in response to the DLL clock signal CLK_DLL, starting from an initial count value which is set in accordance with a CAS latency CL.

The external count value generation unit 430 provides an external clock count value CNT_EXT<0:2> counted in response to an external clock signal CLK_EXT. The external count value generation unit 430 includes a delay model 432 and an external clock counter 434.

The delay model 432 delays the first reset signal RSTB_DLL for a period of time corresponding to a phase difference between the external clock signal CLK_EXT and its corresponding DLL clock signal CLK_DLL, and outputs it as a second reset signal RSTB_EXT.

The external clock counter 434 is reset to an initial count value in response to the second reset signal RSTB_EXT, and executes a counting operation in response to the external clock signal CLK_EXT to provide an external clock count value CNT_EXT<0:2>. Here, the initial count value for the external clock counter 434 is set to 0.

Meanwhile, the output enable signal generation unit 450 latches the external clock count value CNT_EXT<0:2> at a time corresponding to each of a plurality of consecutively applied read commands, and activates an output enable signal OE when any of the latched values LAT_RD1<0:2>, LAT_RD2<0:2>, LAT_RD3<0:2>, and LAT_RD4<0:2> becomes equal to the DLL clock count value CNT_DLL<0:2>. To this end, output enable signal generation unit 450 includes a plurality of latches 452, a plurality of comparators 454, and an output enable signal output unit 456. Here, the plurality of comparators 454 and the output enable signal output unit 456 function as a comparison output unit, such that they may compare values of the plurality of latches 452 with the DLL clock count values CNT_DLL<0:2> and accordingly activate output enable signal OE.

The plurality of latches 452 allow latching of a plurality of values of the external clock count value CNT_EXT<0:2> each corresponding to the timing of consecutively applied read commands RD. The plurality of latches 452 comprise a first latch 452A which latches the external clock count value CNT_EXT<0:2> in response to a first control signal CTR1 and outputs a first latched value LAT_RD1<0:2>, a second latch 452B which latches the external clock count value CNT_EXT<0:2> in response to a second control signal CTR2 and outputs a second latched value LAT_RD2<0:2>, a third latch 452C which latches the external clock count value CNT_EXT<0:2> in response to a third control signal CTR3 and outputs a third latched value LAT_RD3<0:2>, and a fourth latch 452D which latches the external clock count value CNT_EXT<0:2> in response to a fourth control signal CTR4 and outputs a fourth latched value LAT_RD4<0:2>.

Although FIG. 4 illustrates only four latches 452A, 452B, 452C, and 452D included in the plurality of latches 452, the number of latches may vary, depending on tCCD and CAS latency CL. Preferably, the plurality of latches 452 is provided with a enough of latches such that the comparison between the first latched value LAT_RD1<0:2> corresponding to the first read command with the DLL clock count value CNT_DLL<0:2> is not influenced by the following read command.

The first to fourth latches 452A, 452B, 452C, and 452D latch corresponding values of external clock count value CNT_EXT<0:2> in response to the first to fourth control signals CTR1, CTR2, CTR3, and CTR4, respectively. Since there are many possible latch circuits for providing the latching functionality applicable by those skilled in the art, specific details thereof are omitted here.

Meanwhile, the first to fourth controls signals CTR1, CTR2, CTR3, and CTR4 sequentially triggering the first to fourth latches 452A, 452B, 452C, and 452D in response to a read command RD. The control signals which can be generated by a control signal generation unit illustrated in FIG. 5.

Figure 5:
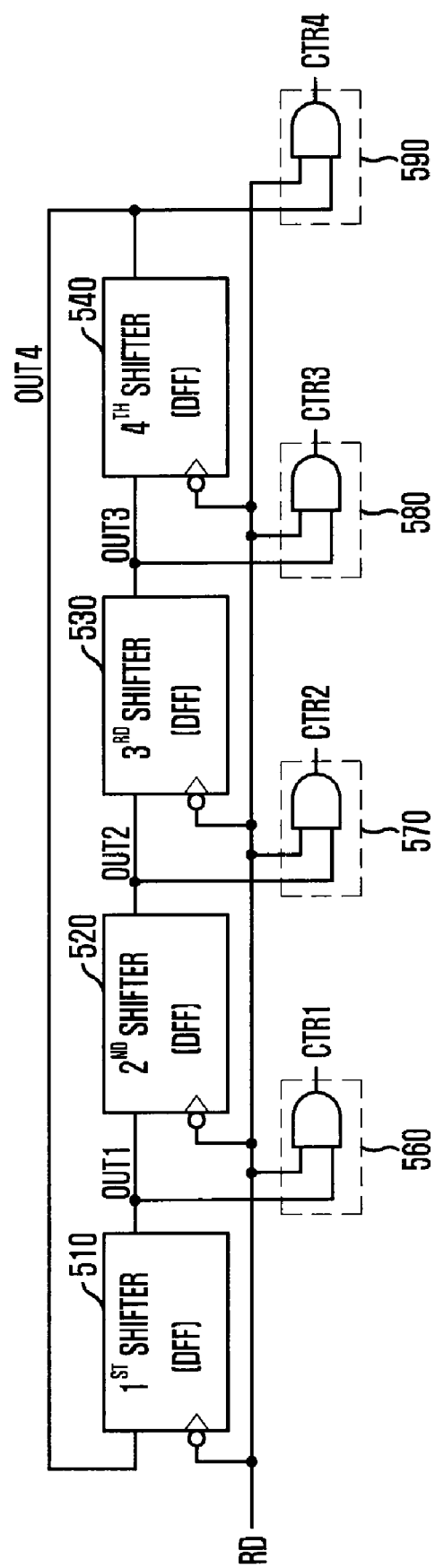
FIG. 5 is a diagram illustrating a control signal generation unit that generates first to fourth control signals CTR1, CTR2, CTR3, and CTR4 in FIG. 4.

FIG. 5 is a circuit diagram illustrating the control signal generation unit that provides the first to fourth control signals CTR1, CTR2, CTR3, and CTR4 in FIG. 4.

Referring to FIG. 5, the control signal generation unit includes first to fourth shifters 510, 520, 530, and 540, and first to fourth output portions 560, 570, 580, and 590.

The first to fourth shifters 510, 520, 530, and 540 each latch an output signal from a previous-stage shifter in response to the read command RD, and each transfer its latched signal to a next-stage shifter. Each of these shifters may, for example, be composed of a conventional D-flip flop, so details thereof are omitted here. Although not specifically illustrated in FIG. 5, is-in response to a reset signal (not shown), the first shifter 510 sets a first output signal OUT1 to a logic 'high' level, while output signals OUT2, OUT3, and OUT4 corresponding to the second to fourth shifters 520, 530, and 540 are each set to a logic 'low' level.

The first to fourth output portions 560, 570, 580, and 590 respectively output corresponding controls signals CTR1, CTR2, CTR3, and CTR4 in response to the read command RD and output signals OUT1, OUT2, OUT3, and OUT4 from respective shifters. These output portions may, for example, be constituted by a conventional AND gate.

Figure 6:
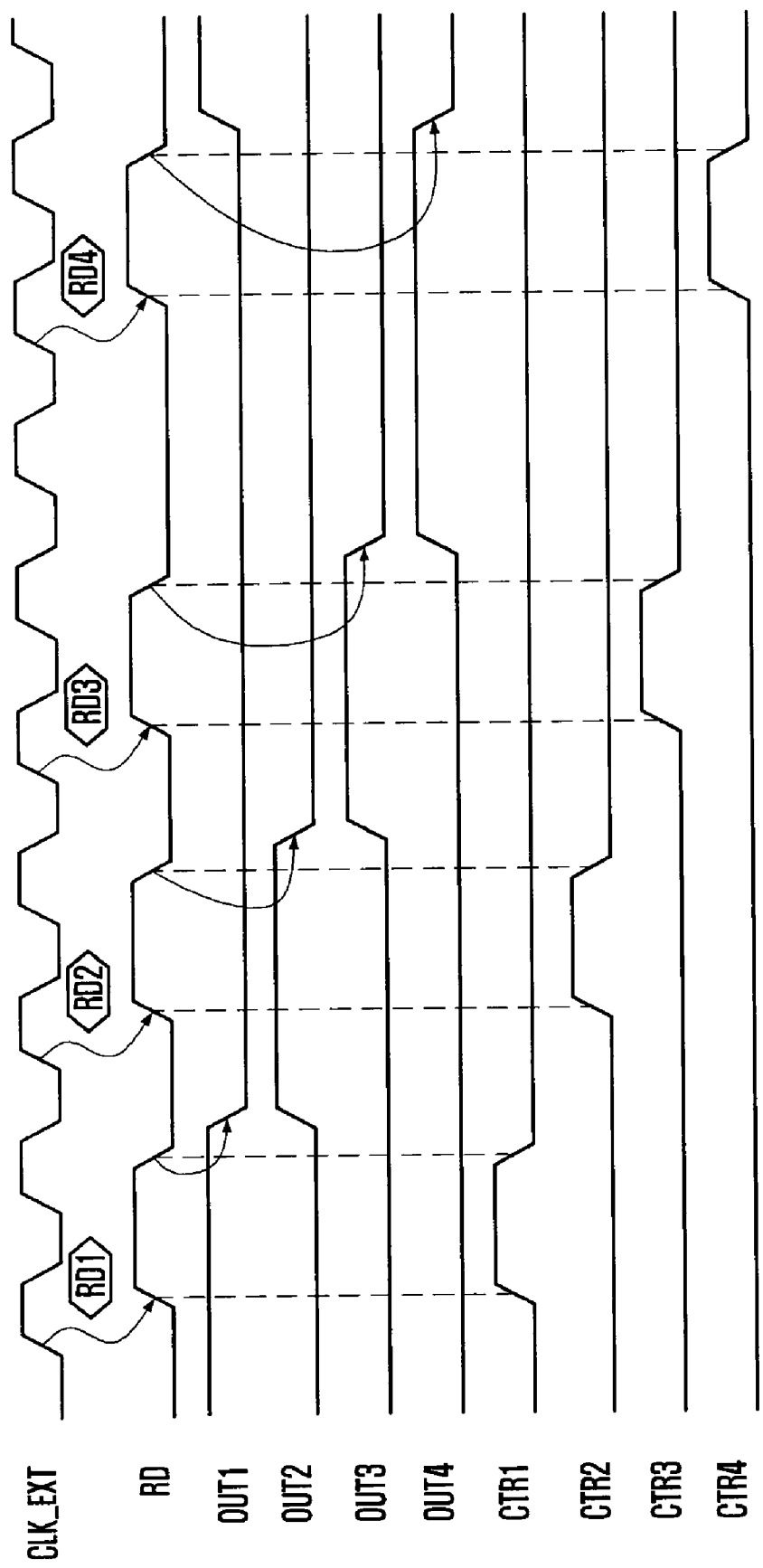
FIG. 6 is a waveform diagram illustrating the waveform of each signal illustrated in FIG. 5.

FIG. 6 is a waveform diagram illustrating the waveform of each signal shown in FIG. 5. Specifically, FIG. 6 shows the waveforms of the external clock signal CLK_EXT, the read command RD, the first to fourth output signals OUT1, OUT2, OUT3, and OUT4, and the first to fourth control signals CTR1, CTR2, CTR3, and CTR4. In this illustration, it is the read commands RD1, RD2, and RD3 are applied at an interval of tCCD and the fourth read command RD4 is applied after the first to third read commands RD1, RD2, and RD3 have been applied.

Referring to FIGS. 5 and 6, the first shifter 510 latches the fourth output signal OUT4 in response to the first read command RD1, and outputs the latched signal as the first output signal OUT1. The second shifter 520 latches the first output signal OUT1 in response to the second read command RD2, and outputs the latched signal as the second output signal OUT2. The third shifter 530 latches the second output signal OUT2 in response to the third read command RD3, and outputs the latched signal as the third output signal OUT3. Lastly, the fourth shifter 540 latches the third output signal OUT3 in response to the fourth read command RD4, and outputs the latched signal as the fourth output signal OUT4.

Next, the first output portion 560 outputs the first control signal CTR1, which is activated when both the read command RD and the first output signal OUT1 are at logic 'high' states; the second output portion 570 outputs the second control signal CTR2, which is activated when both the read command RD and the second output signal OUT2 are at logic 'high' states; the third output portion 580 outputs the third control signal CTR3, which is activated when both the read command RD and the third output signal OUT3 are at logic 'high' states; and the fourth output portion 590 outputs the fourth control signal CTR4, which is activated when both the read command RD and the fourth output signal OUT4 are at logic 'high' states.

As is illustrated in FIG. 6, the first output signal OUT1 is transferred as the second output signal OUT2 in response to a falling edge of the first read command RD1, the second output signal OUT2 is transferred as the third output signal OUT3 in response to a falling edge of the second read command RD2, the third output signal OUT3 is transferred as the fourth output signal OUT4 in response to a falling edge of the third read command RD3, and the fourth output signal OUT4 is transferred as the first output signal OUT1 in response to a falling edge of the fourth read command RD4. In this way, the first to fourth control signals CTR1, CTR2, CTR3, and CTR4 are activated sequentially in response to the first to fourth read commands RD1, RD2, RD3, and RD4, and in response to the first to fourth output signals OUT1, OUT2, OUT3, and OUT4, respectively. As a result, the first to fourth control signals CTR1, CTR2, CTR3, and CTR4 become activated sequentially in response to consecutively applied read commands such that the first to fourth latches 452A, 452B, 452C, and 452D perform latch operations in sequence. Preferably, active intervals of the first to fourth control signals CTR1, CTR2, CTR3, and CTR4 are not overlapped with one another.

Referring back to FIG. 4, the plurality of comparators 454 compare the DLL clock count value CNT_DLL<0:2> with each of the first to fourth latched values LAT_RD1<0:2>, LAT_RD2<0:2>, LAT_RD3<0:2>, and LAT_RD4<0:2>, to output first to fourth comparison result signals CMP1, CMP2, CMP3, and CMP4. For this, four comparators (the first to fourth comparators) 454A, 454B, 454C, and 454D are included in the plurality of comparators 454. Preferably, the first to fourth comparators 454A, 454B, 454C, and 454D and the first to fourth latches 452A, 452B, 452C, and 452D are configured equal number. In addition, there are many possible circuits applicable by those skilled in the art for providing the comparator functionality, so specific details on the circuit configuration thereof are omitted here.

Figure 7:
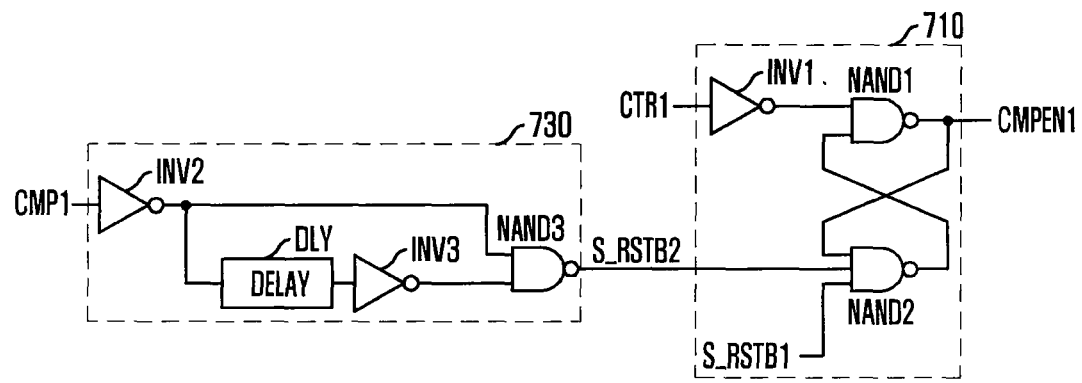
FIG. 7 is a diagram illustrating an enable signal generation unit that generates a first enable signal CMPEN1 in FIG. 4.

The first to fourth comparators 454A, 454B, 454C, and 454D each execute a comparison operation in response to respective first to fourth enable signals CMPEN1, CMPEN2, CMPEN3, and CMPEN4, which are activated sequentially. Here, the first to fourth enable signals CMPEN1, CMPEN2, CMPEN3, and CMPEN4 can be generated by an enable signal generation unit illustrated in FIG. 7. For convenience of explanation, FIG. 7 illustrates only a circuit that is involved with the generation of the first enable signal CMPEN1. Similar circuits are involved with the generation of the second to fourth enable signal CMPEN2, CMPEN3, and CMPEN, as would be appreciated by those skilled in the art.

As noted above, FIG. 7 is a circuit diagram illustrating an enable signal generation unit that generates the first enable signal CMPEN1 illustrated in FIG. 4.

As shown therein, the enable signal generation unit includes a latch circuit 710 for generating a first enable signal CMPEN1 in response to the first control signal CTR1 and to first and second sub-reset signals S_RSTB1 and S_RSTB2, and a reset signal generator 730 for generating the second sub-reset signal S_RSTB2 in response to the first comparison result signal CMP1.

The latch circuit 710 includes a first inverter INV1 for receiving and inverting the first control signal CTR1, a first NAND gate NAND1 for receiving an output signal from the first inverter INV1 and an output signal from a second NAND gate NAND2 to generate a first enable signal COMPEN1, and a second NAND gate NAND2 for taking first and second sub-reset signals S_RSTB1 and S_RSTB2 and an output signal from the first NAND gate NAND1. Here, the reset signal RSTB of FIG. 4 may be used as the first sub-reset signal S_RSTB1.

The reset signal generator 730 includes a second inverter INV2 for receiving and inverting the first comparison result signal CMP1, a delay DLY for delaying an output signal from the second inverter INV2 for a predetermined time, a third inverter INV3 for inverting an output signal from the delay DLY, and a third NAND gate NAND3 for receiving an output signal from the second inverter INV2 and an output signal from the third inverter INV3 to provide the second sub-reset signal S_RSTB2. The following is a brief description of an operation of the enable signal generation unit, with reference to FIG. 8.

Figure 8:
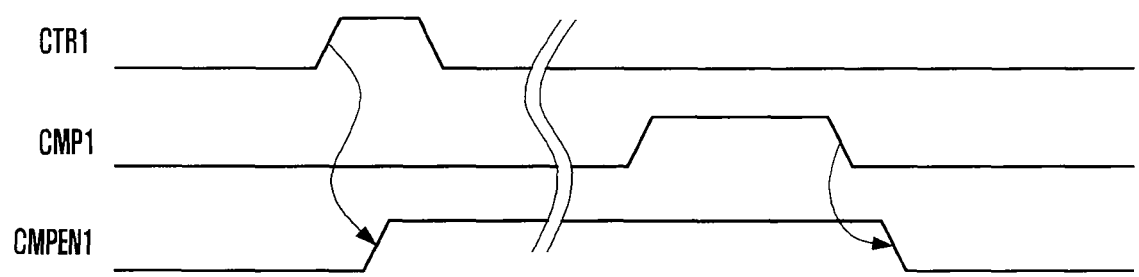
FIG. 8 is a timing diagram illustrating signals inputted/outputted to/from the enable signal generation unit illustrated in FIG. 7.

FIG. 8 is a timing diagram illustrating signals inputted/outputted to/from the enable signal generation unit illustrated in FIG. 7.

Shown in FIG. 8 are the first control signal CTR1, the first comparison result signal CMP1, and the first enable signal CMPEN1. The first enable signal CMPEN1 is activated in response to the first control signal CTR1, and disabled in response to the first comparison result signal CMP1. Namely, the first enable signal CMPEN1 is activated to a logic 'high' level in response to a rising edge of the first control signal CTR1, and is disabled to a logic 'low' level in response to a falling edge of the first comparison result signal CMP1.

As noted above, second to fourth enable signals CMPEN2, CMPEN3, and CMPEN4 may have a similar configuration to that of FIG. 7, and each of the enable signal generation circuits can provide a corresponding enable signal based on a corresponding control signal and a corresponding comparison result signal applied thereto. The first to fourth control signals CTR1, CTR2, CTR3, and CTR4 are activated sequentially, and accordingly, the first to fourth enable signals CMPEN1, CMPEN2, CMPEN3, and CMPEN4 can also be activated sequentially.

Referring back to FIG. 4, the first to fourth comparators 454A, 454B, 454C, and 454D respectively compare the DLL clock count value CNT_DLL<0:2> with each of the first to fourth latched values LAT_RD1, LAT_RD2, LAT_RD3, and LAT_RD4, in response to the first to fourth enable signals CMPEN1, CMPEN2, CMPEN3, and CMMPEN4, respectively. To be more specific, the first comparator 454A compares the first latched value LAT_RD1<0:2> with the DLL clock count value CNT_DLL<0:2> in an active interval of the first enable signal CMPEN1 to output a first comparison result signal CMP1. The second comparator 454B compares the second latched value LAT_RD2<0:2> with the DLL clock count value CNT_DLL<0:2> in an active interval of the second enable signal CMPEN2 to provide a second comparison result signal CMP2. The third comparator 454C compares the third latched value LAT_RD3<0:2> with the DLL clock count value CNT_DLL<0:2> in an active interval of the third enable signal CMPEN3 to provide a third comparison result signal CMP3. The fourth comparator 454D compares the fourth latched value LAT_RD4<0:2> with the DLL clock count value CNT_DLL<0:2> in an active interval of the fourth enable signal CMPEN4 to output a fourth comparison result signal CMP4.

Meanwhile, the output enable signal output unit 456 generates the output enable signal OE in response to the first to fourth comparison result signals CMP1, CMP2, CMP3, and CMP4. In detail, it generates the output enable signal OE, which is activated in response to an active interval of any of the first to fourth comparison result signals CMP1, CMP2, CMP3, and CMP4.

Figure 9:
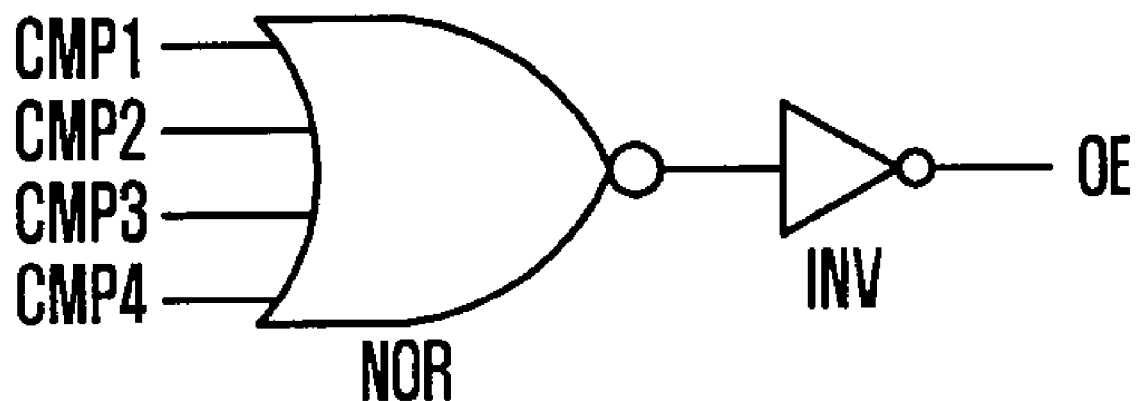
FIG. 9 is a circuit diagram illustrating the output enable signal output unit 456 illustrated in FIG. 4.

FIG. 9 is a circuit diagram illustrating the output enable signal output unit 456 illustrated in FIG. 4.

Referring to FIG. 9, the output enable signal output unit 456 includes a NOR gate NOR for receiving first to fourth comparison result signals CMP1, CMP2, CMP3, and CMP4, and an inverter INV for inverting an output signal from the NOR gate NOR to generate an output enable signal OE.

As discussed above, the first to fourth comparison result signals CMP1, CMP2, CMP3, and CMP4 are activated in response to consecutively applied read commands RD, respectively. The output enable signal OE is activated in response to each of the first to fourth comparison result signals CMP1, CMP2, CMP3, and CMP4. In other words, in response to each read command RD being applied consecutively at an interval of tCCD, the output enable signal OE can be correspondingly activated.

Figure 10:
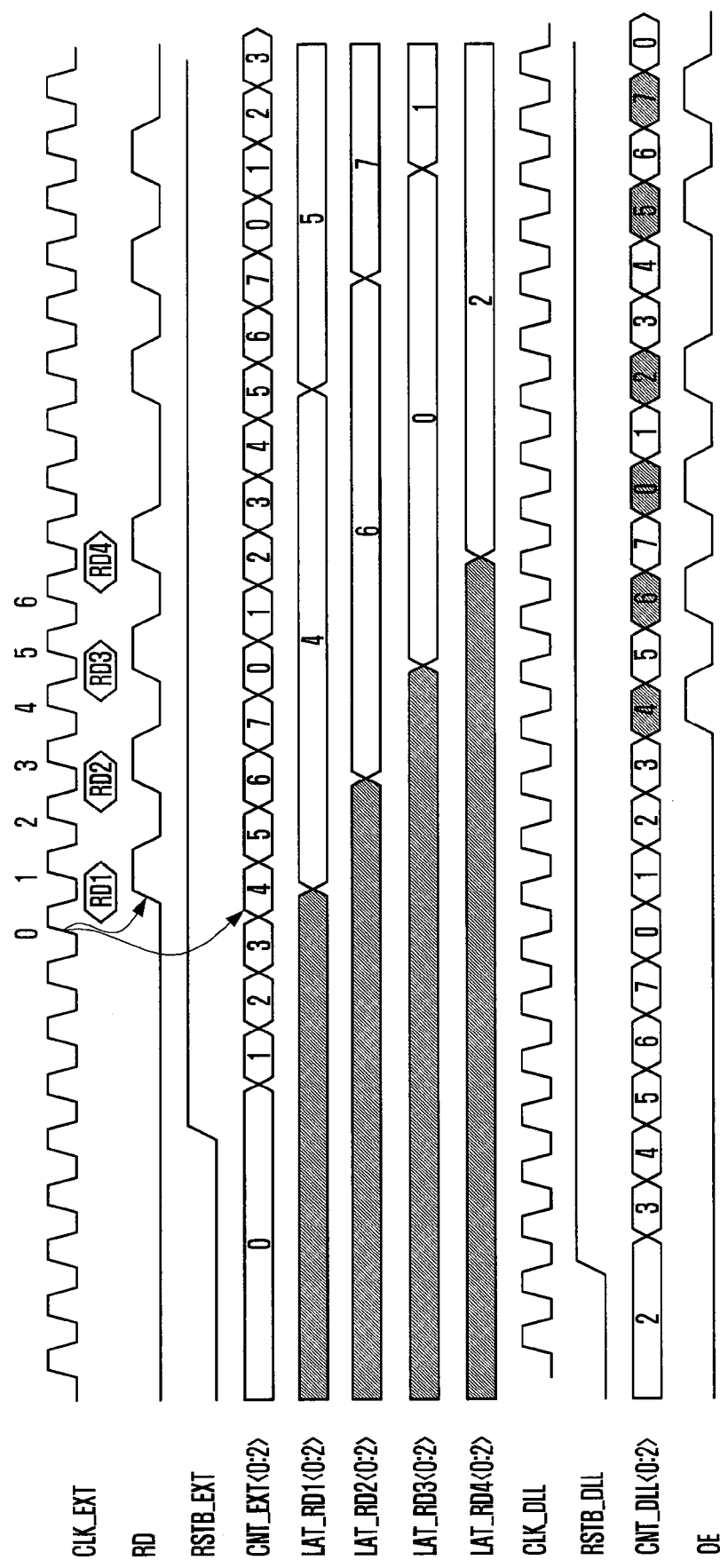
FIG. 10 is a timing diagram illustrating a timing of an operation in the output enable signal generating circuit of FIG. 4.

FIG. 10 is a timing diagram illustrating an operation timing of the output enable signal generating circuit illustrated in FIG. 4. For convenience of explanation, it is first assumed that a CAS latency CL is 7, with a corresponding initial count value of 2.

With reference to FIGS. 4 to 10, an operation of the output enable signal generating circuit in accordance with the first embodiment of the present invention will be described.

First, when the first reset signal RSTB_DLL is activated to a logic 'high' level, the DLL clock counter 416 outputs, in response to a DLL clock signal CLK_DLL, a DLL clock count value CNT_DLL<0:2> counting from the preset initial count value of 2.

Next, the delay model 432 generates a second reset signal RSTB_EXT by imposing a delay time on the first reset signal RSTB_DLL. The external clock counter 434, which has been released from reset in response to the second reset signal RSTB_EXT with a logic 'high' level, outputs, in response to the external clock signal CLK_EXT, the external clock count value CNT_EXT<0:2> counting from the initial count value of 0.

Although not shown in FIG. 10, the first control signal CTR1 is activated in response to a first read command RD1 which is applied at the timing when the external clock signal CLK_EXT is labeled 0, and consequently a first enable signal CMPEN1 is activated. Thus, the first latch 452A latches the external clock count value CNT_EXT<0:2>, i.e., 4, corresponding to when the external clock signal CLK_EXT is labeled 0, and the first comparator 454A compares the first latched value LAT_RD1 with the DLL clock count value CNT_DLL<0:2> to output the first comparison result signal CMP1.

Meanwhile, the second control signal CTR2 is activated in response to a second read command RD2 that is applied at the timing when the external clock signal CLK_EXT is labeled 2, in accordance with tCCD, to make the second enable signal CMPEN2 activated. Thus, the second latch 452B latches the external clock count value CNT_EXT<0:2>, i.e., 6, corresponding to when the external clock signal CLK_EXT is labeled 2, and the second comparator 454B compares the second latched value LAT_RD2 with the DLL clock count value CNT_DLL<0:2> to output the second comparison result signal CMP2.

In much the same manner, the third and fourth latches 452C and 452D also latch respective values of external clock count value CNT_EXT<0:2> corresponding to a third read command RD3 applied at the timing when the external clock signal CLK_EXT is labeled 4 and a fourth read command RD4 applied at the timing when the external clock signal CLK_EXT is labeled 6. The third and the fourth comparators 454C and 454D execute a comparison operation in response to the third and fourth enable signals CMPEN3 and CMPEN4 to provide the third and fourth comparison result signals CMP3 and CMP4, respectively.

The output enable signal output unit 456 outputs the output enable signal OE activated in response to each of the first to fourth comparison result signals CMP1, CMP2, CMP3, and CMP4.

As noted earlier, values of the external clock count value CNT_EXT<0:2>, each corresponding to the timing when each of the read commands RD1, RD2, RD3, and RD4 is applied, are latched by a respective latch, and the latched values LAT_RD1, LAT_RD2, LAT_RD3 or LAT_RD4 are each compared by a corresponding comparator to output a respective comparison result signal CMP1, CMP2, CMP3, or CMP4. In this way, the output enable signal OE is activated in response to each of the read commands RD1, RD2, RD3, and RD4.

Figure 11:
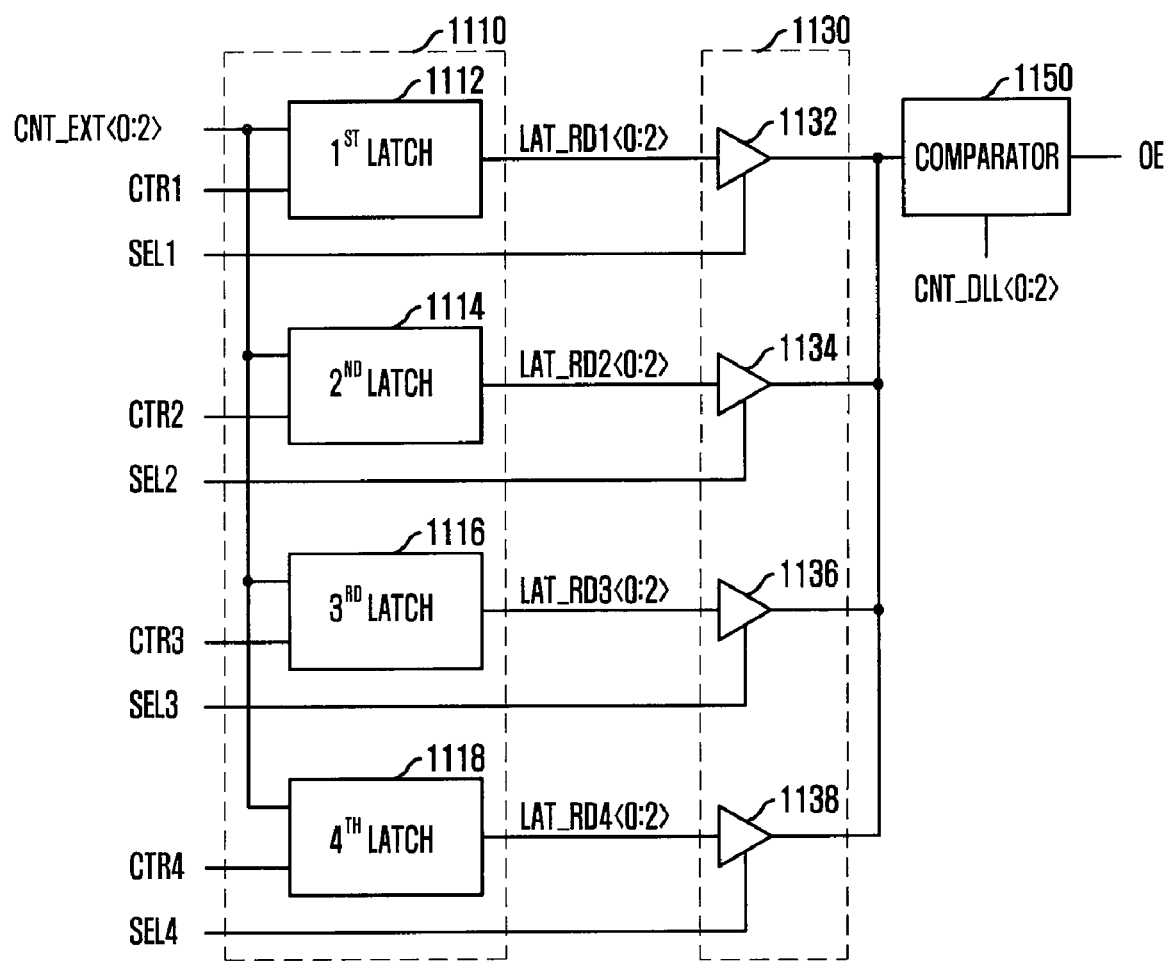
FIG. 11 is a block diagram for illustrating a second embodiment of an output enable signal generation unit 450 of FIG. 4.

In accordance with the above first embodiment of the present invention, even though a plurality of read commands RD are applied at an interval of tCCD, it is possible to enable the output enable signal OE in response to each of consecutive read commands, by employing a plurality of latches with respective comparators FIG. 11 is a block diagram illustrating a second embodiment of the output enable signal generation unit 450 illustrated in FIG. 4.

Referring to FIG. 11, the output enable signal generation unit 450 includes a plurality of latches 1110, a multiplexer 1130, and a comparator 1150. Here, the multiplexer 1130 and the comparator 1150 function as a comparison output unit, such that output signals from the plurality of latches 1110 are compared with DLL clock count values CNT_DLL<0:2> to activate, in sequence, output enable signal OE.

Similar to the plurality of latches in FIG. 4, the plurality of latches 1110 comprises a first latch 1112 for latching the external clock count value CNT_EXT<0:2> in response to a first control signal CTRL to output a first latched value LAT_RD1<0:2>, a second latch 1114 for latching the external clock count value CNT_EXT<0:2> in response to a second control signal CTR2 to output a second latched value LAT_RD2<0:2>, a third latch 1116 for latching the external clock count value CNT_EXT<0:2> in response to a third control signal CTR3 to output a third latched value LAT_RD3<0:2>, and a fourth latch 1118 for latching an external clock count value CNT_EXT<0:2> in response to a fourth control signal CTR4 to output a fourth latched value LAT_RD4<0:2>. As mentioned above, each of the first to fourth latches 1112, 1114, 1116, and 1118 latches the external clock count value CNT_EXT<0:2> in response to a corresponding one of the first to fourth control signals CTR1, CTR2, CTR3, and CTR4. There are many possible latch circuits for providing the latching functionality applicable by those skilled in the art, so further details thereon will be omitted.

Here, the first to fourth control signals CTR1, CTR2, CTR3, and CTR4 sequentially control the first to fourth latches 452A, 452B, 452C, and 452D in response to the read command RD. The control signals can be generated by the control signal generation unit illustrated in FIG. 5.

Meanwhile, the multiplexer 1130 outputs one of the output signals from the first to fourth latches 1112, 1114, 1116, and 1118 in response to first to fourth select signals SEL1, SEL2, SEL3, and SEL4. The multiplexer 1130 includes a first transfer portion 1132 that transfers the first latched value LAT_RD1<0:2> to the comparator 1150 in response to the first select signal SEL1, a second transfer portion 1134 that transfers the second latched value LAT_RD2<0:2> to the comparator 1150 in response to the second select signal SEL2, a third transfer portion 1136 that transfers the third latched value LAT_RD3<0:2> to the comparator 1150 in response to the third select signal SEL3, and a fourth transfer portion 1138 that transfers the fourth latched value LAT_RD4<0:2> to the comparator 1150 in response to the fourth select signal SEL4. Each of the first to fourth transfer portions 1132, 1134, 1136, and 1138 may be constituted, for example, by a tri-state buffer. In the case where one of the first to fourth select signals SEL1, SEL2, SEL3, and SEL4 has a logic 'high' level, its corresponding one of first to fourth latched values LAT_RD1<0:2>, LAT_RD2<0:2>, LAT_RD3<0:2>, and LAT_RD4<0:2> is transferred to the comparator 1150.

The comparator 1150 compares the value provided by multiplexer 1130 with the DDL clock count value CNT_DLL<0:2>, to thereby provide the output enable signal OE. There are many possible circuits applicable by those skilled in the art for providing the comparator functionality for the comparator 1150, so specific details on the circuit configuration thereof are omitted here.

Referring again to FIGS. 4 and 11, the first embodiment shown in FIG. 4 is provided with the same number of comparators and latches such that the output signal from each latch is compared in the respective comparator to provide the output enable signal OE. In the case of the second embodiment shown in FIG. 11, however, the plurality of latches share one comparator 1150. This configuration not only increases the operation speed faster relative to the case in FIG. 5, but also minimizes the size of comparator, which occupies a relatively large area.

One thing to notice here is that active intervals of the first to fourth select signals SEL1, SEL2, SEL3, and SEL4 should not be overlapped with one another. If the first to fourth select signals SEL1, SEL2, SEL3, and SEL4 are overlapped, output signals from the first to fourth transfer portions 1132, 1134, 1136, and 1138 collide with one another, which does not guarantee a smooth operation of the comparator 1150. That is, a desired operation for providing output enable signal OE cannot be generated.

Figure 12:
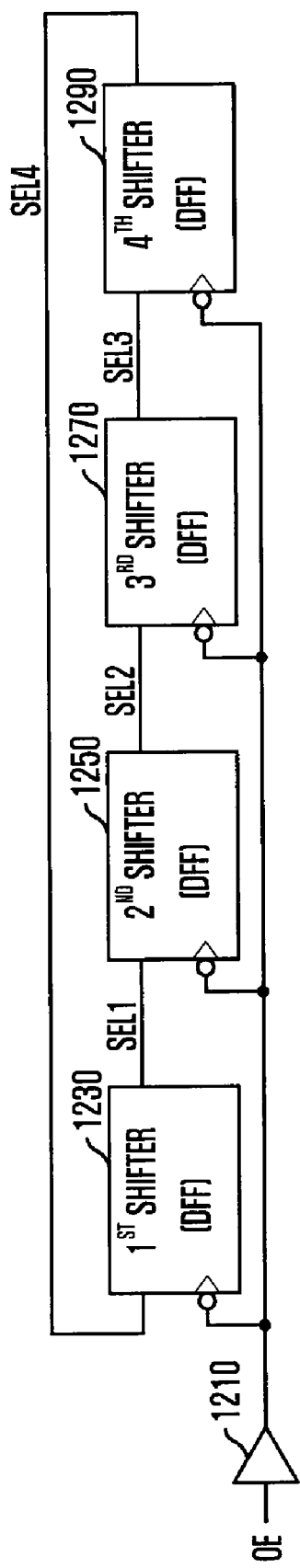
FIG. 12 is a block diagram for illustrating the select signal generation unit that generate first to fourth select signals SEL1, SEL2, SEL3, and SEL4 illustrated in FIG. 11.

FIG. 12 is a block diagram illustrating a select signal generation unit that generates the first to fourth select signals SEL1, SEL2, SEL3, and SEL4 illustrated in FIG. 11.

Referring to FIG. 12, the select signal generation unit includes a buffer 1210 for buffering the output enable signal OE, and first to fourth shifters 1230, 1250, 1270, and 1290. For convenience of explanation, it is assumed that an output signal from the buffer 1210 is identical with an output enable signal OE, although alternative logic can be used to achieve the same results.

The first to fourth shifters 1230, 1250, 1270, and 1290 each latch a select signal from a previous-stage shifter in response to the buffered output enable signal OE, and transfer the latched signal to a next-stage shifter. Any conventional D-flip flop may be utilized to configure each of the shifters, for example, so details thereof are omitted here. Although not specifically illustrated in FIG. 12, in response to a reset signal (not shown), the first shifter 1230 sets the first select signal SEL1 to a logic 'high' level, while the second to fourth shifters 1250, 1270, and 1290 set the second to fourth select signals SEL2, SEL3, and SEL4, respectively, to a logic 'low' level.

In other words, the first to fourth shifters 1230, 1250, 1270, and 1290 are activated sequentially in response to the output enable signal OE, and output the first to fourth select signals SEL1, SEL2, SEL3, and SEL4 such that active intervals are not overlapped with one another. The select signal generation unit with the above configuration can be substituted for the enable signal generation unit that generates the first to fourth enable signals CMPEN1, CMPEN2, CMPEN3, and CMPEN4 in FIG. 5. For such a substitution, the first select signal SEL1 can be used as a substitute for the first enable signal CMPEN1, the second select signal SEL2 can be used as a substitute for the second enable signal CMPEN2, the third select signal SEL3 can be used as a substitute for the third enable signal CMPEN3, and the fourth select signal SEL4 can be used as a substitute for the fourth enable signal CMPEN4.

Figure 13:
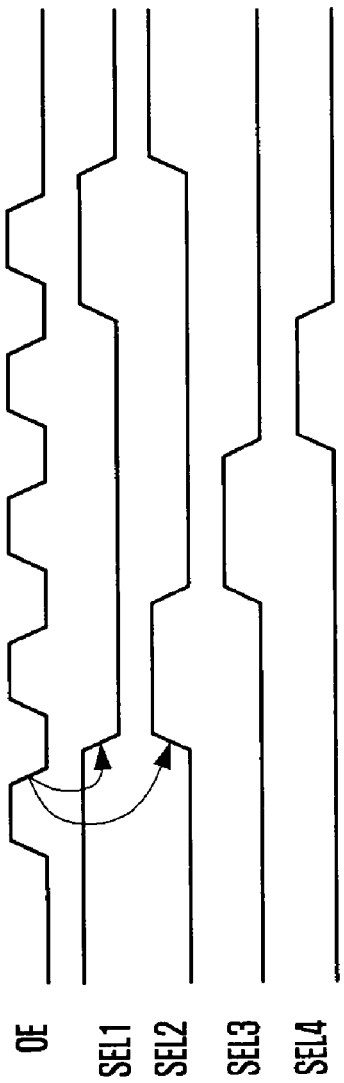
FIG. 13 is a waveform diagram illustrating the waveform of each signal illustrated in FIG. 12.

FIG. 13 is a waveform diagram illustrating the waveform of each signal illustrated in FIG. 12. In detail, FIG. 12 illustrated the waveforms of the output enable signal OE, and the first to fourth select signals SEL1, SEL2, SEL3, and SEL4.

Referring to FIGS. 12 and 13, the first shifter 1230 latches the fourth select signal SEL4 in response to the output enable signal OE, and outputs the latched signal as the first select signal SEL1. The second shifter 1250 latches the first select signal SEL1 in response to the output enable signal OE, and outputs the latched signal as the second select signal SEL2. The third shifter 1270 latches the second select signal SEL2 in response to the output enable signal OE, and outputs the latched signal as the third select signal SEL3. Lastly, the fourth shifter 1290 latches the third select signal SEL3 in response to the output enable signal OE, and outputs the latched signal as the fourth select signal SEL4.

In this manner, the first to fourth select signals SEL1, SEL2, SEL3, and SEL4, which are not overlapped with one another, sequentially drive the first to fourth transfer portions 1132, 1134, 1136, and 1138 in FIG. 11, thereby preventing collisions among the output signals from the first to fourth transfer portions 1132, 1134, 1136, and 1138.

Thus, values of the external clock count value CNT_EXT<0:2> when each of the read commands RD1, RD2, RD3, and RD4 are applied are latched by a corresponding latch, and the respective latched values LAT_RD1, LAT_RD2, LAT_RD3, and LAT_RD4 are then compared sequentially by the comparator. Based on the results of each comparison, the output enable signal OE is activated in response to each of the read commands RD1, RD2, RD3, and RD4.

As discussed above, an output enable signal generating circuit in accordance with the present invention can generate an output enable signal OE that is activated in response to a plurality of read commands (e.g., RD1, RD2, RD3, or RD4) even though the read commands may be input at an interval of tCCD. This means that output enable signal generating circuit can generate an output enable signal OE which is activated with a timing corresponding to a CAS latency CL, and further can generate an output enable signal OE which is activated at a desired timing in response to any read command RD. Such a stable output enable signal OE acts as a basis for outputting data at a desired timing. As a result, the output enable signal generating circuit in accordance with the present invention can improve the precision and reliability of a semiconductor memory device, and is suitable to be used in devices with ever-increasing operation frequency and ever-increasing CAS latency CL.

While the above-described second embodiment illustrates a case where a 3-state buffer is utilized for each of the transfer portions 1132, 1134, 1136, and 1138 in FIG. 11, the present invention may also be applicable to a case where another circuit is used as a substitute to output an input signal in response to a control signal. Besides, it should be noted that the logic gates and the transistors illustrated in the embodiment discussed earlier may be implemented at different positions and with different kinds, depending on polarity of an input signal.

As described above, embodiments of the present invention generate an output enable signal that is activated in response to each of a plurality of consecutively applied read commands, and thus can output data at a proper timing which corresponds to a desired CAS latency. Accordingly, the present invention can improve the precision and reliability in operations of a semiconductor memory device, particularly, in a read operation.

While the present invention has been described with respect to the specific embodiments, it will be apparent to those skilled in the art that various changes and modifications may be made without departing from the spirit and scope of the invention as defined in the following claims.

What is claimed is:

1. An output enable signal generating circuit, comprising:
   a first count value generation unit that provides a first count value by counting from an initial count value corresponding to a CAS latency information, the counting being performed in response to an internal clock signal;
   a second count value generation unit that provides a second count value by counting in response to an external clock signal;
   an output enable signal generation unit that provides an output enable signal that is activated at each time that the second count value and the first count value become equal to each other comm., wherein the output enable signal veneration unit comprises a plurality of latches which sequentially latch the second count value in response to a plurality of control signals, respectively; and
   a control signal generation unit that provides the plurality of control signals in response to a plurality of read commands, wherein the control signal generation unit comprises:
      a plurality of shifters that each latch an output signal from a previous-stage shifter in response to a respective one of the plurality of read commands, and provide the output signal to a next-stage shifter; and
      a plurality of output portions that each provide one of the control signals in response to a respective one of the plurality of read commands and an output signal from a respective shifter.

2. The output enable signal generating circuit of claim 1 wherein the number of the plurality of latches depends on a relation between a minimum time gap tCCD between two read commands, and the CAS latency information.

3. The output enable signal generating circuit of claim 1, wherein the first count value generation unit includes:
   a reset signal generator that provides a first reset signal synchronized with the internal clock signal;
   an initializing unit that provides the initial count value corresponding to the CAS latency information; and
   a first counter for providing the first count value by counting from the initial count value in response to the first reset signal and the internal clock signal.

4. The output enable signal generating circuit of claim 3, wherein the second count value generation unit comprises:
   a delay model that delays the first reset signal for a phase difference between the external clock signal and the internal clock signal; to provide a second reset signal; and
   a second counter that provides the second count value that is by counting in response the second reset signal and the external clock signal.

5. An output enable signal generating circuit, comprising:
   a first count value generation unit that provides a first count value by counting from an initial count value corresponding to a CAS latency information, the counting being executed performed in response to an internal clock signal;
   a second count value generation unit that provides a second count value by counting in response to an external clock signal;
   a plurality of latches that each latch the second count value in response to of plurality of control signals;
   a comparison output unit that activates an output enable signal based on a comparison of output signals from the plurality of latches with the first count value: and
   a control signal generation unit that, in response to a plurality of read commands, provides the plurality of control signals to sequentially control the plurality of latches. wherein the control signal generation unit comprises:
      a plurality of shifters that each latch a signal output from a previous-stage shifter and transfer the signal to a next-stage shifter in response to a respective one of the plurality of read commands.

6. The output enable signal generating circuit of claim 5, wherein the comparison output unit includes:
   a plurality of comparators that compares each of the second count values latched with the first count value to output comparison result signals in response to a plurality of enable signals; and
   an output portion that provides an output enable signal in response to each of the comparison result signals.

7. The output enable signal generating circuit of claim 6, wherein each of the plurality of enable signals is activated in response to a corresponding control signal and deactivated in response to a corresponding comparison result signal.

8. The output enable signal generating circuit of claim 6, wherein the number of the plurality of comparators is equal to the number of the plurality of latches.

9. The output enable signal generating circuit of claim 6, wherein active intervals of the plurality of enable signals are not overlapped with one another.

10. The output enable signal generating circuit of claim 5 wherein the control signal generation unit further comprises:
    a plurality of output portions that each outputs one of the control signals in response to one of the read commands and an output signal from a respective shifter.

11. The output enable signal generating circuit of claim 5, wherein the comparison output unit comprises:
    a multiplexer that provides one of the latched values from the plurality of latches in response to a plurality of select signals;
    a select signal generation unit that provides the plurality of select signals so as to sequentially select an output signals of the multiplexer; and
    a comparator that compares the output signal from the multiplexer with the first count value to provide the output enable signal.

12. The output enable signal generating circuit of claim 11, wherein the multiplexer comprises:
    a plurality of transfer portions that each transfer an output signal from a corresponding latch to the comparator in response to the a corresponding select signal.

13. The output enable signal generating circuit of claim 11, wherein the selection signal generation unit comprises:
    a plurality of shifters that each latches a select signal from a previous-stage shifter and transfer the select signal to a next-stage shifter in response to the output enable signal.

14. The output enable signal generating circuit of claim 11, wherein active intervals of the plurality of select signals do not overlap with one another.

15. The output enable signal generating circuit of claim 5, wherein the number of the plurality of latches is based on a relation between a minimum time gap tCCD between the read commands, and the CAS latency information.

16. The output enable signal generating circuit of claim 5, wherein the first count value generation unit comprises:
   a reset signal generator that provides a first reset signal synchronized with the internal clock signal;
   an initializing unit that provides the initial count value corresponding to the CAS latency information; and
   a first counter for providing the first count value by counting from the initial count value in response to the first reset signal and the internal clock signal.

17. The output enable signal generating circuit of claim 16, wherein the second count value generation unit comprises:
   a delay model that delays the first reset signal for a phase difference between the external clock signal and the internal clock signal to provide a second reset signal; and
   a second counter that provides the second count value by counting in response the second reset signal and the external clock signal.

* * * * *